(12) United States Patent
Gong et al.

(10) Patent No.: US 9,257,393 B1
(45) Date of Patent: Feb. 9, 2016

(54) FAN-OUT WAFER LEVEL PACKAGES CONTAINING EMBEDDED GROUND PLANE INTERCONNECT STRUCTURES AND METHODS FOR THE FABRICATION THEREOF

(71) Applicants: Zhiwei Gong, Chandler, AZ (US); Weng F. Yap, Chandler, AZ (US)

(72) Inventors: Zhiwei Gong, Chandler, AZ (US); Weng F. Yap, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/500,698

(22) Filed: Sep. 29, 2014

(51) Int. Cl.
*H01L 23/48* (2006.01)
*H01L 23/538* (2006.01)
*H01L 21/56* (2006.01)
*H01L 21/78* (2006.01)
*H01L 21/48* (2006.01)

(52) U.S. Cl.
CPC ........ *H01L 23/5389* (2013.01); *H01L 21/4853* (2013.01); *H01L 21/563* (2013.01); *H01L 21/78* (2013.01); *H01L 23/5386* (2013.01)

(58) Field of Classification Search
CPC .......... H01L 2224/02379; H01L 2224/25171; H01L 2224/40108; H01L 2224/41171; H01L 2224/49171
USPC ........................................................ 257/695
See application file for complete search history.

(56) References Cited

U.S. PATENT DOCUMENTS

| | | |
|---|---|---|
| 2013/0049182 A1 | 2/2013 | Gong et al. |
| 2013/0078753 A1* | 3/2013 | Hayes et al. .................... 438/51 |
| 2013/0207255 A1 | 8/2013 | Magnus et al. |
| 2013/0215583 A1 | 8/2013 | Vincent |

* cited by examiner

*Primary Examiner* — Daniel Whalen
(74) *Attorney, Agent, or Firm* — Ingrassia Fisher & Lorenz, P.C.

(57) ABSTRACT

Fan-Out Wafer Level Packages (FO-WLPs) and methods for fabricating FO-WLPs containing Embedded Ground Planes (EGPs) and backside EGP interconnect structures are provided. In one embodiment, the method includes electrically coupling an EGP to a backside terminal of a first microelectronic device through a backside EGP interconnect structure. A molded package body is formed around the first microelectronic device, the EGP, and the EGP interconnect structure. The molded package body has a frontside at which the EGP is exposed. One or more Redistribution Layers are formed over the frontside of the molded packaged body and contain at least one interconnect line electrically coupled to the backside contact through the EGP and the backside EGP interconnect structure.

18 Claims, 3 Drawing Sheets

FAN-OUT WAFER LEVEL PACKAGES CONTAINING EMBEDDED GROUND PLANE INTERCONNECT STRUCTURES AND METHODS FOR THE FABRICATION THEREOF

TECHNICAL FIELD

Embodiments of the present invention relate generally to microelectronic packaging and, more particularly, to Fan-Out Wafer Level Packages (FO-WLPs) and methods for fabricating FO-WLPs containing Embedded Ground Planes (EGPs) and EGP interconnect structures, which provide backside connection to microelectronic devices contained within the FO-WLPs.

BACKGROUND

A FO-WLP includes a molded package body in which one or more microelectronic devices are embedded. The embedded microelectronic devices typically include at least one semiconductor die, but can also include other devices, such as Surface Mount Devices or "SMDs." The microelectronic devices are typically embedded in the molded package body at a location substantially coplanar with the frontside of the package body. One or more frontside Redistribution Layers (RDLs) containing electrically-conductive interconnect lines are build-up over the frontside of the package body to provide the desired interconnections between the packaged devices (if multiple devices are embedded in the FO-WLP) and an externally-accessible contact array formed over the frontside RDLs. In instances wherein the FO-WLP has a double-sided package architecture, additional RDLs can also be produced over the backside of the molded package body. Backside RDLs are usefully produced when, for example, the FO-WLP further includes one or more Backside Contacts (BSCs), which extend to the backsides of the packaged devices to provide electrical connection thereto. Microelectronic devices requiring backside interconnection can include certain types of Field Effect Transistors (FETs), Silicon Controlled Rectifiers (SCRs), Resonant Gate Transistors (RGTs), Insulated Gate Bipolar Transistors (IGBT), and other active and passive devices.

The above-described double-sided package architecture usefully provides interconnection to the backsides of one or more microelectronic devices embedded within a molded package body. Additionally, as the BSCs are typically formed by dispensing bodies of an Electrically Conductive Adhesive (ECA) over the packaged devices, variances in device height can readily be accommodated through adjustments in BSC thickness. These advantages notwithstanding, double-sided package architectures remain limited in certain respects. As a primary limitation, the build-up of backside RDLs can add considerable time, cost, and complexity to the FO-WLP manufacturing process. Additionally, such package architectures are often produced to include Through Package Vias (TPVs) to provide electrical interconnection between the frontside and backside RDLs, which further adds cost and complexity to the FO-WLP manufacturing process.

It is thus desirable to provide FO-WLPs wherein backside interconnection to packaged devices is provided in a relatively straightforward and structurally robust manner and, preferably, without reliance upon backside RDLs, TPVs, and other such structures associated with conventional double-sided package architectures. It would also be desirable if, in at least some embodiments, such backside interconnection could be provided to multiple microelectronic devices having varying heights contained within a single FO-WLP. Finally, it would be desirable to provide methods for fabricating FO-WLPs having the foregoing characteristics on a relatively high volume, low cost basis. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
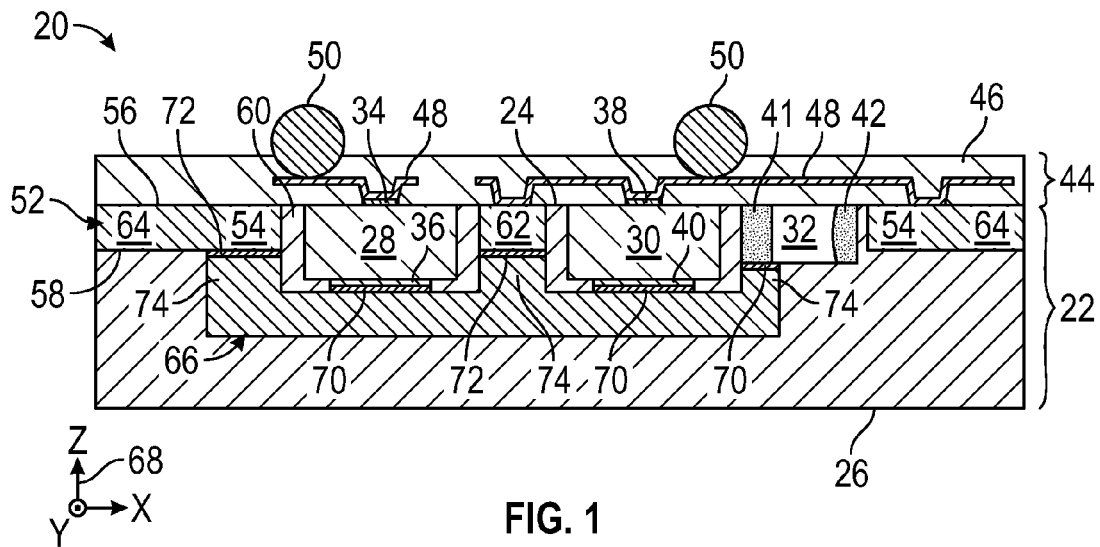
FIGS. 1 and 2 are side cross-sectional and planform cutaway views, respectively, of a FO-WLP including an EGP and a backside EGP interconnect structure, which are produced as separate pieces and bonded together prior to panelization or overmolding, as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes exemplary embodiments of FO-WLPs and methods for producing FO-WLPs wherein backside contact is made to one or more microelectronic components utilizing an Embedded Ground Plane (EGP) and a backside EGP interconnect structure; the term "embedded ground plane" and the corresponding acronym "EGP" referring to an electrically-conducive structure, such as a metal frame, which provides a connection to electrical ground and which is embedded within a molded package body or encapsulant. Within a given FO-WLP, the EGP interconnect structure can electrically interconnect an EGP to any practical number of microelectronic devices, even when the devices vary in size and shape. The EGP can then be leveraged to provide backside interconnection to the microelectronic device or devices within a given FO-WLP in a relatively straightforward and structurally robust manner. Additionally, reliance on backside RDLs, TPVs, and other such features to provide backside contact is significantly reduced or eliminated. Thus, in preferred embodiments, the FO-WLP can be produced as a single sided package lacking backside RDLs and TPVs. The cost and complexity of FO-WLP manufacture can be favorably reduced as a result.

As described below, a given EGP interconnect structure can be integrally formed with an EGP as a single, electrically-conductive piece. Alternatively, the EGP interconnect structure and the EGP can be produced as separate pieces, which are bonded together during fabrication of the FO-WLP. An ECA or other electrically-conductive bonding material can be utilized to produce the desired electrical interconnections between an EGP interconnect structure and one or more backside terminals located the packaged device(s) prior to overmolding and the formation of the molded package body. The molded package body is advantageously produced as a part of a larger panel, which is then processed and ultimately singulated to yield a number of discrete FO-WLPs. An example of such a panel level FO-WLP fabrication process is described below in conjunction with FIGS. 3-7. First, however, an exemplary embodiment of a FO-WLP containing a backside EGP interconnect structure will be described in conjunction with FIGS. 1 and 2.

FIG. 1 is a cross-sectional view of a FO-WLP 20, as illustrated in accordance with a first exemplary embodiment of the present invention. FO-WLP 20 includes a molded package body 22 having a first principal surface or "frontside" 24 and a second, opposing principal surface or "backside" 26. One or more microelectronic components are embedded within molded package body 22. The number and type of microelectronic components embedded within molded package body 22 will vary amongst embodiments depending upon the design and functionality of FO-WLP 20. In the exemplary embodiment shown in FIG. 1, molded package body 22 contains three microelectronic devices: (i) first semiconductor die 28, (ii) a second semiconductor die 30, and (iii) an SMD 32. Semiconductor die 28 has a number of bond pads 34 on the frontside thereof (one of which can be seen in FIG. 1) and backside metallization including a backside contact 36, such as a backside ground terminal. Similarly, semiconductor die 30 includes one or more frontside bond pads 38 and a backside contact 40, which may also be a ground terminal. Die 28 and 30 can carry number of semiconductor devices or integrated circuits that required backside connection including, but not limited to FETs, SCRs, RGTs, IGBTs, and combinations thereof. By comparison, SMD 32 includes opposing electrically-conductive end terminals 41 and 42. SMD 32 is oriented horizontally in molded package body 22 such that terminals 41 and 42 are accessible from the inwardly-facing side of SMD 32; that is, the side of SMD 32 facing into package body 22 and located opposite frontside 24. SMD 32 can be, for example, a discrete capacitor, resistor, inductor, or diode. In further embodiments, SMD 32 can be embedded within molded package body 22 in a vertical orientation, and various other SMDs can be embedded within package body 22 along with SMD 32, die 28, and die 30.

Semiconductor die 28 and 30 are embedded in molded package body 22 such that their respective bond pads 34 and 38 are substantially coplanar with and exposed at frontside 24 of package body 22. Similarly, SMD 32 is embedded within package body such that the upper edges of SMD terminals 41 and 42 are exposed at frontside 24 of package body 22. One or more RDLs 44 are formed over frontside 24 of package body 22 to provide the desired interconnections between die 28, die 30, and SMD 32. Specifically, RDLs 44 are produced to include a dielectric body 46 containing a number of electrically-conductive interconnect lines 48 (two of which can be seen in FIG. 1). Interconnect lines 48 electrically couple bond pads 34 of die 28, bond pads 38 of die 30, and terminal 42 of SMD 32, as appropriate, to complete the wiring structure of FO-WLP 20. Additionally, interconnect lines 48 can also provide electrical interconnection to the contacts of an externally-accessible contact array formed over RDLs 44. For example, as shown in FIG. 1, a Ball Grid Array (BGA) including a number of solder balls 50 can be produced over RDLs 44 and interconnected with the packaged devices through interconnect lines 48. In further embodiments, FO-WLP 20 can be produced to include other types of Input/Output (I/O) interfaces and associated interconnect structures, which can include any combination of contact arrays (e.g., BGAs, Land Grid Arrays, bond pads, stud bumps, etc.), RDLs, leadframes, interposers, wire bonds, through package vias, and the like. Furthermore, FO-WLP 20 need not include externally-accessible points-of-contact in all embodiments and can instead communicate wirelessly via an antenna structure, while being powered by an internal battery or energy harvesting.

Figure 2:
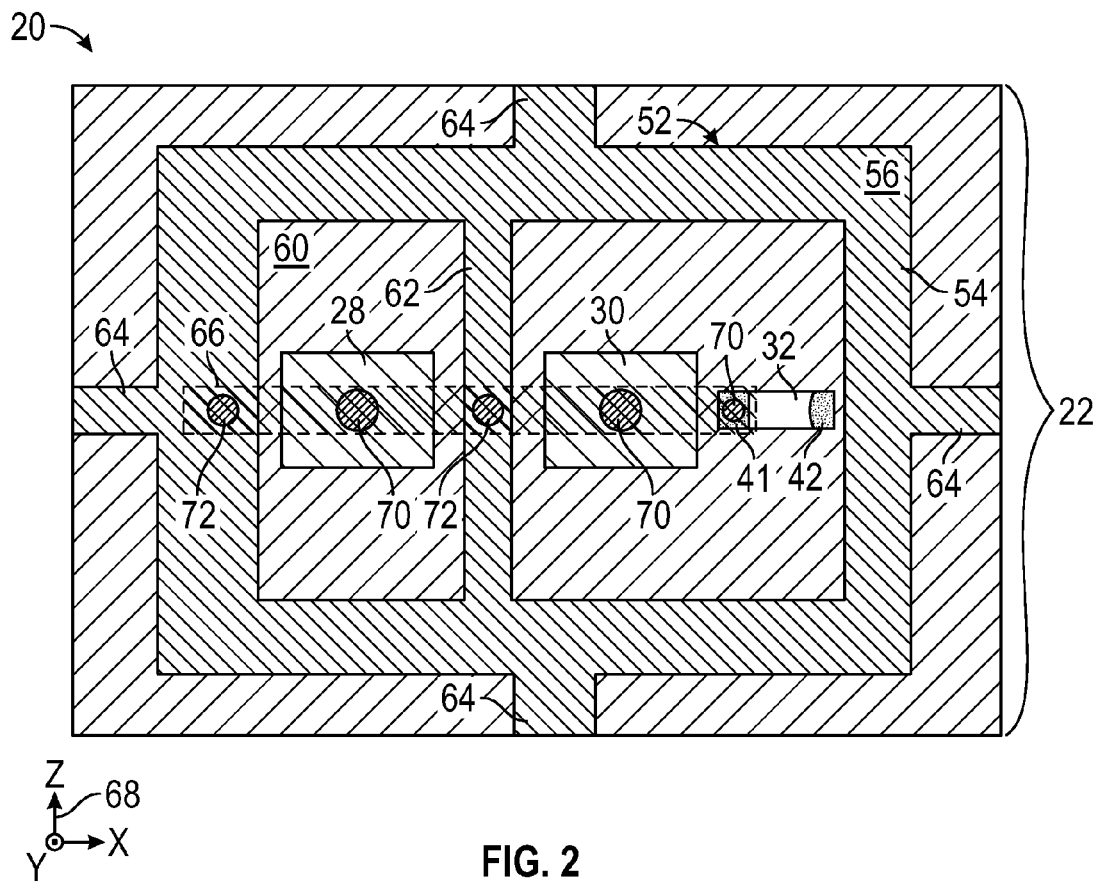

FIG. 2 is a planform cutaway view of FO-WLP 20, as viewed from the bottom with a lower portion of molded package body 22 removed. Referring collectively to FIGS. 1 and 2, at least one EGP 52 is further embedded within molded package body 22 at a location laterally adjacent the packaged devices. EGP 52 includes an electrically-conductive (e.g., copper) body 54 having opposing principal surfaces 56 and 58 (identified in FIG. 1). EGP 52 is embedded within package body 22 such that surface 58 faces into molded package body 22 and is bonded to the below-described backside EGP interconnect structure 66. Conversely, EGP surface 56 faces away from the interior of package body 22 and is substantially coplanar with frontside 24 of package body 22. Selected interconnect lines 48 can be formed in contact with EGP surface 56 to electrically couple EGP 52 to electrical ground through selected BGA solder balls 50; the term "ground" referring to any electrical current return path, whether or not an actual Earth connection is present. Interconnect lines 48 can also electrically couple EGP surface 56 to selected frontside bond pads 34 and 38 of die 28 and 30, respectively, in certain embodiments. As shown most clearly in FIG. 2, EGP body 54 has a generally rectangular planform geometry and includes a central opening 60 in which semiconductor die 28, semiconductor die 30, and SMD 32 are positioned. EGP body 54 thus extends around an outer peripheral portion of molded package body 22 to circumscribe the packaged devices and provide a convenient ground connection thereto. In further embodiments, EGP body 54 can assume other planform shapes and may not extend around all or any of the microelectronic devices embedded within molded package body 22.

EGP 52 can be produced to include various structure features in addition to EGP body 54. For example, as shown in FIGS. 1 and 2, EGP 52 can be produced to include an interior EGP wall 62, which extends into central opening 60 and adjacent one or more of the packaged devices. Interior EGP wall 62 provides an additional location at which the packaged devices and/or backside EGP interconnect structure 66 (described below) can be connected to electrical ground. Interior wall 62 can also provide added structural support to the below-described EGP interconnect structure 66 and may possibly increase the overall structural integrity of FO-WLP 20. In the illustrated example, and as shown most clearly in FIG. 2, EGP 52 further includes a number of tie bars or spars 64, which extend outwardly from EGP body 54 to the sidewalls of molded package body 22. During manufacture, spars 64 previously joined EGP 52 to a number of other EGPs, which collectively formed an interconnected EGP frame or array. Positioning and overmolding the EGPs while physically interconnected as an EGP array can facilitate batch production of FO-WLPs. Specifically, during manufacture of FO-WLP 20, the EGP array can be embedded within a larger molded panel and then separated into discrete EGPs including EGP 52 (FIGS. 1 and 2) during the panel singulation process, as described below in conjunction with FIG. 7.

FO-WLP 20 further includes at least one backside EGP interconnect structure 66. EGP interconnect structure 66 is shown in phantom in FIG. 2 to better illustrate underlying bonding layers 70 and 72, as further described below. EGP interconnect structure 66 is embedded within molded package body 22 at a location underlying EGP 52, as viewed from frontside 24 of package body 22. Interconnect structure 66 thus overlaps axially with a central portion of EGP 52, as taken along an axis orthogonal to frontside 24 or as taken along the Z-axis identified in FIGS. 1 and 2 by coordinate legend 68. Die 28, die 30, and SMD 32 are located between backside EGP interconnect structure 66 and frontside 24 of molded packaged body 22. A number of electrically-conductive bonding layers 72 are formed between backside contact 36, backside contact 40, and SMD terminal 41 to complete the desired interconnections between die 28, die 30, and SMD 32, respectively, and the underlying interconnect structure 66. As described below, bonding layers 72 can be composed of a selectively deposited ECA or another electrically-conductive bonding material. In the illustrated embodiment, EGP interconnect structure 66 and EGP 52 are produced as separate (e.g., metal) pieces. One or more layers 72 of electrically-conductive bonding material can likewise be provided between the underside of EGP interconnect structure 66 and EGP interior surface 58 to further electrically join interconnect structure 66 and EGP 52. As indicated in FIGS. 1 and 2, EGP interconnect structure 66 can be produced as a metal (e.g., copper) clip or elongated beam having a generally rectangular shape. In further embodiments, EGP interconnect structure 66 can be formed from other electrically-conductive materials and can be produced to have other geometries suitable for interconnecting EGP 52 with the packaged components.

As briefly noted above, bonding layers 70 and 72 can be composed of various different electrically-conductive bonding materials. In embodiments wherein an electrical connection is provided between two contact or contact areas composed of solder-wettable alloys (e.g., copper), bonding layers 70 and 72 can be produced by the selective deposition of solder paste or by imparting backside EGP interconnect structure 66 with a solder finish and performing a solder reflow process after placing EGP interconnect structure 66 in contact with EGP 52, die 28, die 30, and SMD 32. It is preferred, however, that bonding layers 70 and 72 are produced from an ECA, such as silver-, copper-, or other metal-filled epoxy. Advantageously, an ECA can be deposited over selected regions of EGP interconnect structure 66 and/or over EGP 52, die 28, die 30, and SMD 32 prior to positioning of interconnect structure 66 utilizing, for example, a needle dispensing or screen printing process. Additionally, an ECA can be utilized to provide electrical connections between interconnect structure 66, die 28, and die 30 regardless of whether the point-of-contacts provided on the backsides of die 28 and 30 are metal/alloy features (e.g. bond pads) or non-metal features (e.g., silicon bodies or layers). Furthermore, ECAs typically have curing temperatures between about 100° and about 190° C. and, therefore, below solder reflow temperatures, which typically exceed 190° C. and may approach 260° C. (depending upon whether an Eutectic solder is utilized). Further discussion of the manners in which bonding layers 70 and 72 can be formed between EGP interconnect structure 66, EGP 52, and the packaged devices is provided below in conjunction with FIG. 4.

EGP 52, backside contact 36, backside contact 40, and SMD terminal 41 may not align along a horizontal or X-Y plane in all embodiments, depending upon EGP thickness and the respective heights of die 28, die 30, and SMD 32 (the height of SMD 32 measured as taken along an axis orthogonal to frontside 24 corresponding to the Z-axis in FIGS. 1 and 2). If desired, bonding layers 70 and 72 can be deposited to have an increased thickness to help compensate for minor variations in EGP thickness and the respective heights of die 28, die 30, and SMD 32. However, in instances wherein the height or thickness of EGP 52, die 28, die 30, and/or SMD 32 vary more significantly, backside EGP interconnect structure 66 can be fabricated to include axially-extending projections or stepped features along its underside to accommodate such differences. For example, as shown in FIG. 1, backside EGP interconnect structure 66 can be produced to include a number of stepped features 74, which extend axially from the main body of EGP interconnect structure 66. Stepped features 74 extend from the main body of EGP interconnect structure 66 toward EGP 52 and SMD 32 to accommodate or compensate for differences in thickness of EGP 52 and the respective heights of die 28, die 30, and SMD 32.

As should be appreciated from the foregoing description, EGP 52 and backside EGP interconnect structure 66 are employed to provide electrical interconnection to the backsides of one or more packaged devices contained within molded package body 22. EGP interconnect structure 66 can be produced from a low resistance metal (e.g., copper) and to have an increased cross-sectional area as compared to, for example, RDL interconnect lines 48. As a result, EGP interconnect structure 66 provides a relatively direct and structurally robust connection between EGP 52 and the packaged devices to improve the overall electrical performance of FO-WLP 20. Additionally, EGP interconnect structure 66 can be utilized to provide the desired backside interconnections without reliance upon TSVs, backside RDLs, or other such features commonly associated with double sided package architectures and which can add considerable time, cost, and complexity to the manufacturing process. This advantage notwithstanding, FO-WLP 20 can be produced to have a double-sided packaged architecture or otherwise include TPVs, backside RDLs, and other such features in further embodiments. Moreover, EGP interconnect structure 66 can be produced to include axial extensions or stepped features that that a single interconnect structure can provided EGP interconnections to multiple microelectronic components even when varying in size and shape. Finally, as a still further advantage, FO-WLP 20 can be produced in parallel with a number of other FO-WLPs utilizing a relatively high volume, lost cost fabrication process. An example of a fabrication process suitable for producing FO-WLP 20 along with a number of other FO-WLPs will now be described in conjunction with FIGS. 3-7.

Figure 3:
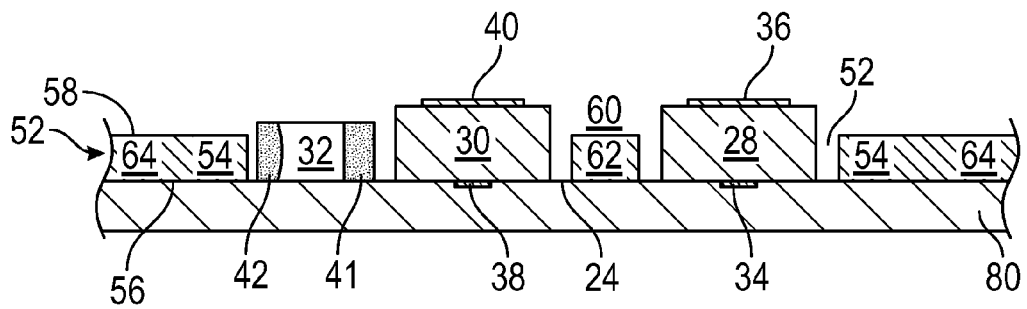
FIGS. 3-7 are cross-sectional views of the FO-WLP illustrated in FIGS. 1 and 2, as shown at various stages of completion and produced in accordance with an exemplary embodiment of the present invention.

FIGS. 3-7 are cross-sectional views of a FO-WLP 20, as illustrated at various stages of manufacture and shown in accordance with an exemplary embodiment of the present invention. As described below, FO-WLP 20 can be produced by processing a molded panel (e.g., molded panel 82 partially shown in FIGS. 5-7), which is ultimately singulated to yield FO-WLP 20 in its completed form along with a number of other FO-WLPs. The other FO-WLPs produced pursuant to the below-described fabrication process may or may not be substantially identical to FO-WLP 20; however, the process steps described herein will typically be performed globally across the molded panel and are consequently generally descriptive of the processing of the panel, as a whole. With initial reference to FIG. 3, production of FO-WLP 20 commences with the placement of a number of microelectronic devices in predetermined groupings on a temporary substrate 80. Only a relatively small portion of temporary substrate 80 supporting those devices included within FO-WLP 20 is shown in FIG. 3 to avoid unnecessarily obscuring the drawings. Prior to or after placement of die 28, die 30, and SMD 32, EGP 52 is further positioned on temporary substrate 80 such that outwardly-facing EGP surface 56 contacts the upper surface of substrate 80 and such that die 28, die 30, and SMD 32 are received within central opening 60. The other, non-illustrated EGPs can likewise be positioned with respect to the other microelectronic devices distributed across substrate 80 in a similar manner. As this juncture of manufacture, spars 64 of EGP 52 are physically connected to the spars of neighboring EGPs (not shown) such that EGP 52 and the other, non-illustrated EGPs collectively form an interconnected EGP array. This spar-to-spar connection is later severed during panel singulation, as described below in conjunction with FIG. 7.

Figure 4:
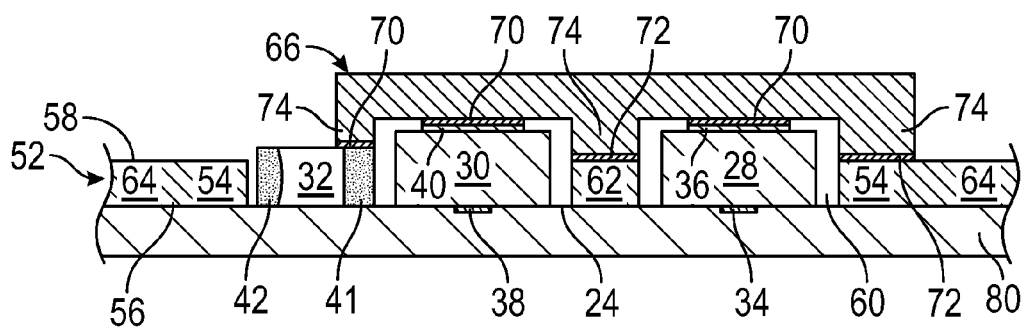

Advancing to FIG. 4, backside EGP interconnect structure 66 is next positioned over EGP 52, semiconductor die 28, semiconductor die 30, and SMD 32. The desired electrical interconnections are formed in conjunction with placement of EGP interconnect structure 66. In one embodiment, electrically-conductive bonding layers 70 and 72 are deposited between the underside of EGP interconnect structure 66 and there respective contacts of EGP 52, die 28, die 30, and SMD 32 prior to positioning of interconnect structure 66. The electrically-conductive bonding material can be deposited onto either selected regions of EGP interconnect structure 66 or selected regions of EGP 52, backside contact 36 of die 28, backside contact 40 of die 30, and end terminal 42 of SMD 32 prior to positioning of interconnect structure 66. Suitable deposition processing include, but are not limited to, needle dispensing and screen printing techniques. In one embodiment, bonding layers 70 and 72 are deposited to thicknesses between 10 and 50 microns (μm). However, bonding layers 70 and 72 can be thicker or thinner in further embodiments. Thermal curing can be performed after deposition of the electrically-conductive bonding material and placement of backside EGP interconnect structure 66, as appropriate. For example, in embodiments wherein bonding layers 70 and 72 are formed via deposition of a metal-filled epoxy, a high temperature sintering process can be carried-out to consolidate the metal particles contained within the epoxy. Although not shown in FIG. 4, it will be appreciated that additional EGP interconnect structures are likewise positioned over and interconnect with the other, non-illustrated EGPs 52 distributed across substrate 80 in a similar manner.

After positioning and interconnection of backside EGP interconnect structure 66 and the other non-illustrated EGP interconnect structures distributed across temporary substrate 80, an overmolding or panelization process is carried-out. By way of non-limiting example, panelization can be performed as follows. First, a non-illustrated mold frame having a central cavity or opening is positioned over temporary substrate 80 and around EGP 52, backside EGP interconnect structure 66, die 28, die 30, SMD 32, and the various other microelectronic components, EGP, and EGP interconnect structures supported by substrate 80. An electrically-insulative encapsulant or mold compound, such as a silica-filled epoxy, is dispensed into the cavity of the mold frame. The encapsulant flows over and around EGP 52, backside EGP interconnect structure 66, die 28, die 30, SMD 32, and the other microelectronic components, EGPs, and EGP interconnect structures supported by substrate 80. The encapsulant can then be solidified by thermal curing (e.g., heating in a partially-evacuated chamber) to yield a solid panel in which the above-listed components are embedded. The panel is conveniently produced as a relatively thin, disc-shaped body or mass having a generally circular planform geometry; however, the panel body can be fabricated to have any desired shape and dimensions. In other embodiments, the panel can be produced utilizing various other known fabrication techniques including, for example, compression molding, dispense, and lamination processes.

Figure 5:
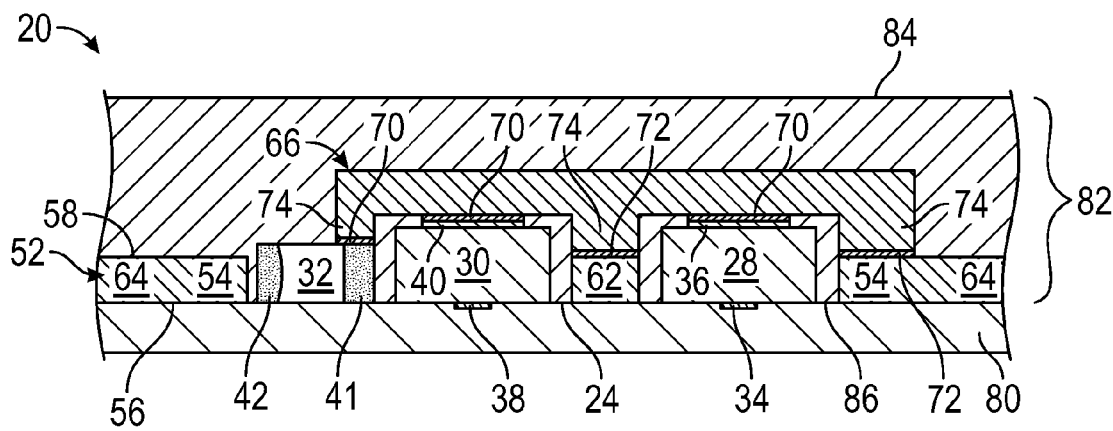
Figure 6:
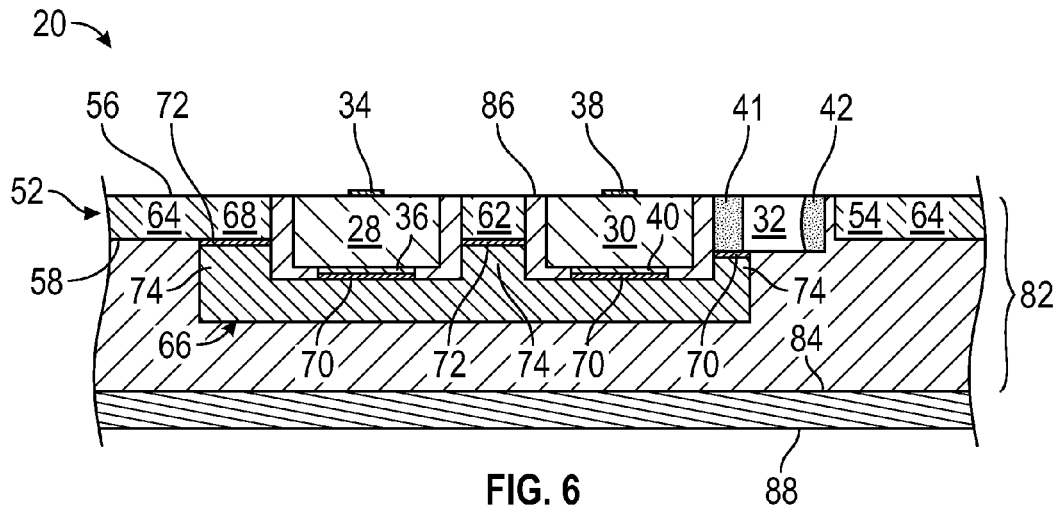
Figure 7:
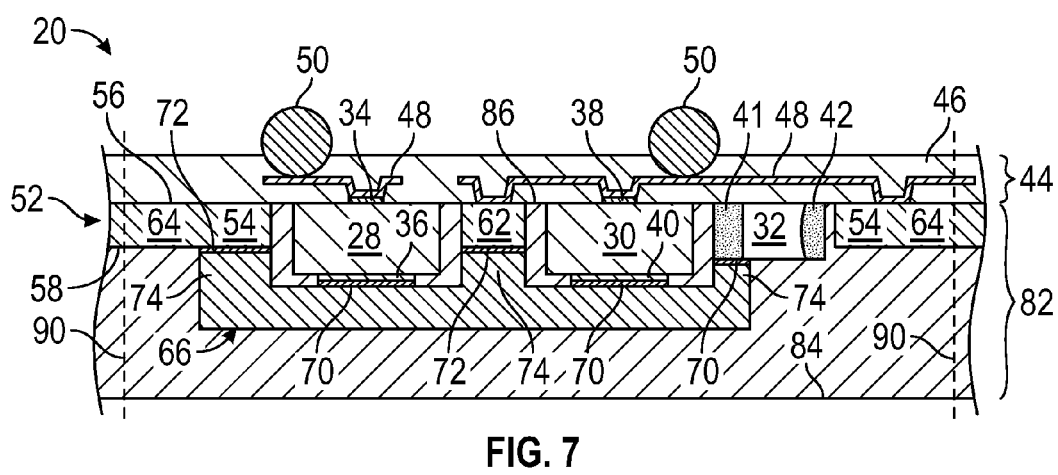

FIG. 5 illustrates a portion of a molded panel 82 produced pursuant to the above-described encapsulation process and encompassing partially-completed FO-WLP 20. Molded panel 82 includes a backside 84 and an opposing frontside 86. Semiconductor die 28, semiconductor die 30, and SMD 32 are positioned within molded panel 82 such that bond pads 34, bond pads 38, and SMD terminals 42 are exposed at panel frontside 86. Outwardly-facing surface 58 of EGP 52 is also exposed at and substantially coplanar with panel frontside 86. Backside thinning of molded panel 82 can be performed, if desired, to bring panel 82 to a desired final thickness. Molded panel 82 is next thermally released or otherwise removed from temporary substrate 80 to reveal panel frontside 86. Molded panel 82 is then inverted and attached to a support structure, such as ceramic carrier 88 shown in FIG. 6. RDLs 44 can be formed over panel 82 by, for example, spinning-on or otherwise depositing one or more dielectric layers and forming interconnect lines 48 therein. Interconnect lines 48 can be produced utilizing well-known lithographical patterning and conductive material (e.g., copper) deposition techniques. The resultant structure is shown in FIG. 7.

After build-up of RDLs 44 over frontside 86 of molded panel 82, solder mask openings are formed in the outermost or last RDL (e.g., a solder mask layer) by lithographical patterning to expose solder pads formed in RDLs 44 and electrically coupled to interconnect lines 48. Ball attach and solder reflow processes can then be utilized to produce BGA solder balls 50 in contact with the solder pads and electrically coupled to EGP 52, die 28, die 30, and SMD 32 through interconnect lines 48. Finally, as indicated by dashed lines 90 in FIG. 7, molded panel 82 is singulated to produce a plurality of discrete FO-WLPs including completed FO-WLP 20, as shown in FIGS. 1 and 2. Singulation is preferably carried-out utilizing a dicing saw; however, other singulation processes can also be utilized including, for example, laser cutting and water jetting. As may be appreciated by comparing FIG. 7 to FIGS. 1 and 2, singulation produces molded package body 22 from molded panel 82 and imparts package body with substantially vertical sidewalls. Stated differently, molded package body 22 is the singulated piece of molded panel 80 include within FO-WLP 20. Similarly, the other singulated pieces of molded panel 82 (not shown) make-up the molded package bodies of the other FO-WLPs produced in parallel with FO-WLP 20. Additionally, in embodiments wherein EGP 52 is joined to other EGPs in an array, singulation severs spars 64 to separate the EGPs into discrete units.

There has thus been provided an exemplary fabrication process for producing an FO-WLP wherein electrical interconnection to the backsides of one or more packaged components is provided through an EGP and an associated EGP interconnect structure. As described above, the EGP and EGP interconnect structure can provide backside connection to practical number of microelectronic devices, even when the devices vary in size and shape. In this manner, the EGP can be leveraged to provide backside interconnection to the microelectronic device or devices within a given FO-WLP in a relatively straight forward and structurally robust manner. Furthermore, by utilizing the EGP interconnect structures to provide an intra-mold backside ground connections, the need to produce TPVs, backside RDLs, and other wiring features associated with doubled-sided packaged architectures can be reduced or eliminated. The complexity, duration, and cost of FO-WLP manufacture can be favorably reduced as a result. In the above-described exemplary embodiment, the EGP and the backside EGP interconnect structure are produced as separated (e.g., metal) pieces, which are joined utilizing an electrically-conductive bonding material. However, in other embodiments, the EGP structure can be produced as a single (e.g., metal) piece. To further illustrate this point, an exemplary embodiment of a FO-WLP including a single piece EGP structure will now be described in conjunction with FIG. 8.

Figure 8:
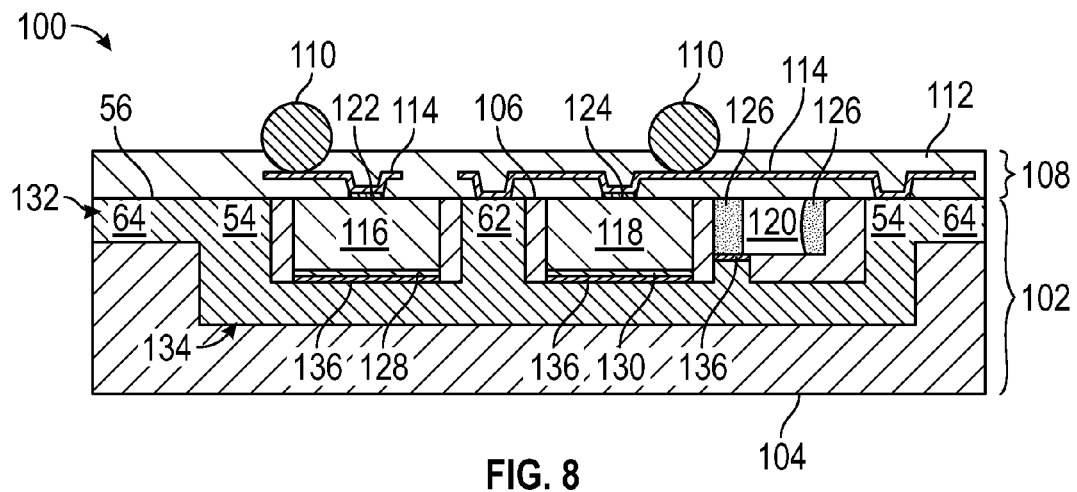
FIG. 8 is a cross-sectional views of a FO-WLP including an EGP and an EGP interconnect structure, which are produced as single or monolithic piece, as illustrated in accordance with a further exemplary embodiment of the present invention.

FIG. 8 is a cross-sectional views of a FO-WLP 100, as illustrated in accordance with a further exemplary embodiment of the present invention. In many respects, FO-WLP 100 is similar to FO-WLP 20 described above in conjunction with FIGS. 1-7. For example, FO-WLP 100 includes a molded package body 102 having a frontside 104 and an opposing backside 106. One or more RDLs 108 are formed over frontside 104 of molded package body 102, and a BGA including solder balls 110 is produced over the outermost or last RDL 108. RDLs 108 include a dielectric body 112 in which a number of interconnect lines 114 are formed. Interconnect lines 114 provide electrical communication between BGA solder balls 110 and the microelectronic component or components embedded within molded package body 102. Once again, a first semiconductor die 116, a second semiconductor die 118, and an SMD 120 have been embedded within package body 102. Interconnect lines 104 provide electrical communication between bond pads 122 of die 116, bond pads 124 of die 118, and terminals 126 of SMD 120 and selected BGA solder balls 110. Semiconductor die 116 and 118 are further produced to include backside contacts 128 and 130, respectively. As was previously the case, an EGP 132 and a backside EGP interconnect structure 134 are further embedded in molded package body 102. Furthermore, layers 136 of an electrically-conductive bonding material are utilized to electrically connect backside contacts 128 and 130 and SMD terminal 126 to selected regions of EGP interconnect structure 134. Bonding layers 136 can be produced from the materials described above and are preferably produced from an ECA.

In the case of FO-WLP 100, and in contrast to FO-WLP 20 (FIGS. 1-7), EGP 132 and backside EGP interconnect structure 134 are integrally formed as a single, electrically-conductive body, such as a metal (e.g., copper) piece. During fabrication of FO-WLP 100, die 116, die 118, and SMD 120 can first be positioned on a temporary substrate. ECA or another electrically-conductive bonding material can then be selectively dispensed over the underside of interconnect structure 134 or over backside contact 128, backside contact 130, and SMD terminal 126. As a single piece, EGP 132 and EGP interconnect structure 134 are then placed on temporary substrate and over die 116, die 118, and SMD 120. Curing is then carried-out to solidify bonding layers 136 and complete the desired interconnects such that die 116, die 118, and SMD 120 are electrically coupled to EGP 132 through interconnect structure 134. Afterwards, molded package body 102 and, more generally, a molded panel can be formed around die 116, die 118, SMD 120, EGP 132, and EGP interconnect structure 134 utilizing an overmolding process of the type described above. The molded panel can then be processed and singulated to yield the completed FO-WLP 100 shown in FIG. 8 along with a number of other completed FO-WLPs.

There has thus been provided multiple exemplary embodiments of FO-WLPs and methods for producing FO-WLPs wherein backside contact is made to one or more microelectronic components utilizing an EGP and a backside EGP interconnect structure. In accordance with embodiments of the present invention, the EGP interconnect structure can extend over the backside or backsides of the devices contained within the package body, and an ECA or other electrically-conductive bonding material can be utilized to bond the interconnect structure to contacts or contacts present on the device backsides. The EGP structure interconnect structure can be integrally formed with the EGP as a single piece or, instead, produced as a separate piece, which is bonded to the EGP utilizing the electrically-conductive bonding material. In this manner, backside connection to the microelectronic device or devices contained within a given FO-WLP can be provided through an EGP and without reliance upon backside RDLs, TPVs, and other such features commonly associated with double-sided package architectures (although the possibility that embodiments of the FO-WLP can include such features is not precluded). This, in turn, can significantly reduce the cost, complexity, and duration of the FO-WLP manufacturing process.

In one embodiment, the FO-WLP fabrication method includes electrically coupling an EGP to a backside terminal of a first microelectronic device (e.g., a backside ground terminal of a semiconductor die) through a backside EGP interconnect structure. A molded package body is formed around the first microelectronic device, the EGP, and the EGP interconnect structure. The molded package body has a frontside at which the EGP is exposed. In a preferred implementation, the molded body is formed around the first microelectronic device, the EGP, and the EGP interconnect structure utilizing a panelization process of the type described above such that the package body is part of a larger molded panel, which is later singulated to define the sidewalls of the package body. One or more Redistribution Layers are formed over the frontside of the molded packaged body and contain at least one interconnect line electrically coupled to the backside contact through the EGP and the backside EGP interconnect structure.

In a further embodiment, the method includes the step or process of placing EGPs and semiconductor die on a temporary substrate. After or in conjunction with placement of the EGPs and semiconductor die on the temporary substrates, EGP interconnect structures are bonded to backside ground terminals provided on the semiconductor die. A molded panel is formed around the EGPs, the EGP interconnect structures, and the semiconductor die. The molded panel is then singulated to yield a plurality of FO-WLPs each including a molded package body, an EGP, an EGP interconnect structure, and at least one semiconductor die having a backside ground terminal electrically coupled to the EGP through the EGP interconnect structure.

The foregoing has also provided embodiments of a FO-WLP. In one embodiment, the FO-WLP includes a molded package body, a first microelectronic device embedded in the molded package body and having a backside contact, an EGP further embedded in the molded package body, and a backside EGP interconnect structure embedded in the molded package body. The EGP interconnect structure is bonded to the backside contact such that the first microelectronic device is electrically coupled to the EGP through the backside EGP interconnect structure. In further embodiments, one or more of the following statements may also apply: (i) the backside EGP interconnect structure may extend over the backside contact and be electrically coupled thereto utilizing an electrically-conductive adhesive; (ii) the EGP and the backside EGP interconnect structure may be integrally formed as a single, electrically-conductive piece; (iii) the EGP and the backside EGP interconnect structure can assume the form of separate electrically-conductive pieces, while the backside EGP interconnect structure may be joined to the EGP utilizing an electrically-conductive bonding material; (iv) the first microelectronic device can assume the form of a semiconductor die, while the backside contact assumes the form of a ground terminal provided on the backside of the semiconductor die; or (v) the backside EGP interconnect structure can assume the form of a metal clip. In still further embodiments, the FO-WLP can include a second microelectronic device embedded in the molded package body and electrically coupled to the EGP through the backside EGP interconnect structure. In such embodiments, the second microelectronic device can have a height less than the first microelectronic device, while the backside EGP interconnect structure has one or more stepped features compensating for the difference in height between the first and second microelectronic devices.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic component" is utilized in a broad sense to refer to an electronic component, element, or structure produced on a relatively small scale and amenable to packaging in the above-described manner. Microelectronic components include, but are not limited to, integrated circuits formed on semiconductor die, Microelectromechanical Systems (MEMS) components, passive electronic components, optical components, and other small scale electronic components capable of providing processing, memory, sensing, radiofrequency, optical, and actuator functionalities, to list but a few examples. Microelectronic components also include other discrete or separately-fabricated structures that can be integrated into the package, such as preformed via structures and preformed antenna structures.

What is claimed is:

1. A method for fabricating a Fan-Out Wafer Level Package (FO-WLP), comprising:
   electrically coupling an Embedded Ground Plane (EGP) to a backside contact of a first microelectronic device through a backside EGP interconnect structure;
   electrically coupling the backside EGP interconnect structure between the EGP and a backside contact of a second microelectronic device;
   forming a molded package body around the first microelectronic device, the second microelectronic device, the EGP, and the backside EGP interconnect structure, the molded package body having a frontside at which the EGP is exposed; and
   producing one or more Redistribution Layers (RDLs) over the frontside of the molded packaged body, the one or more RDLs containing at least one interconnect line electrically coupled to the backside contact of the first microelectronic device through the EGP and the backside EGP interconnect structure.

2. The method of claim 1 wherein electrically coupling the backside EGP interconnect structure between the EGP and the backside contact comprises bonding the backside EGP interconnect structure to the backside contact utilizing an electrically-conductive adhesive.

3. The method of claim 1 further comprising:
   placing the first microelectronic device on a temporary substrate; and
   after placing the first microelectronic device, positioning the backside EGP interconnect structure to extend at least partially over the backside contact.

4. The method of claim 3 further comprises dispensing an electrically-conductive bonding material onto at least one of the backside EGP interconnect structure and the backside contact prior to positioning the backside EGP interconnect structure to extend at least partially over the backside contact.

5. The method of claim 3 further comprising placing the EGP on the temporary substrate at a location laterally adjacent the first microelectronic device and underlying the backside EGP interconnect structure.

6. The method of claim 1 wherein the first and second microelectronic devices have different heights, and wherein the method further comprises fabricating the backside EGP interconnect structure to have at least one step feature accommodating the difference in the heights of the first and second microelectronic devices.

7. The method of claim 1 further comprising electrically coupling the backside EGP interconnect structure between the EGP and a first terminal of a Surface Mount Device (SMD).

8. The method of claim 7 wherein the producing comprises producing the one or more RDLs to contain an interconnect line electrically coupled to a second terminal of the SMD.

9. The method of claim 1 wherein the EGP and the backside EGP interconnect structure are integrally formed as a single piece, and wherein the method further comprises:
   placing the microelectronic device on a temporary substrate; and
   positioning the EGP and backside EGP interconnect structure adjacent the microelectronic component such that the EGP interconnect structure extends at least partially over the backside contact.

10. The method of claim 1 wherein the EGP and the backside EGP interconnect structure are separate pieces, and wherein the method further comprises:
    placing the first microelectronic device and the EGP on a temporary substrate; and
    positioning the backside EGP interconnect structure over the EGP and over the first microelectronic device after placing the EGP and the first microelectronic device on the temporary substrate.

11. The method of claim 10 further comprising bonding the backside EGP interconnect structure to the EGP utilizing an electrically-conductive bonding material.

12. A method for fabricating a Fan-Out Wafer Level Package (FO-WLP), comprising:
   placing a microelectronic device on a temporary substrate;
   electrically coupling an Embedded Ground Plane (EGP) to a backside contact of a first microelectronic device through a backside EGP interconnect structure, the EGP and the backside EGP interconnect structure integrally formed as a single piece and positioned adjacent the microelectronic component such that the EGP interconnect structure extends at least partially over the backside contact;
   forming a molded package body around the first microelectronic device, the EGP, and the backside EGP interconnect structure, the molded package body having a frontside at which the EGP is exposed; and
   producing one or more Redistribution Layers (RDLs) over the frontside of the molded packaged body, the one or more RDLs containing at least one interconnect line electrically coupled to the backside contact through the EGP and the backside EGP interconnect structure.

13. The method of claim 12 further comprising electrically coupling the backside EGP interconnect structure between the EGP and a first terminal of a Surface Mount Device (SMD).

14. The method of claim 13 wherein the producing comprises producing the RDLs to contain an interconnect line electrically coupled to a second terminal of the SMD.

15. A method for fabricating a Fan-Out Wafer Level Package (FO-WLP), comprising:
   placing an Embedded Ground Plane (EGP) and a first microelectronic device having a backside contact on a temporary substrate;
   dispensing an electrically-conductive conductive bonding material over selected regions of the EGP;
   after dispensing the electrically-conductive bonding material, positioning a backside EGP interconnect structure over the EGP, over the first microelectronic device, and in contact with the electrically-conductive conductive bonding material to electrically couple the EGP to the backside contact through a backside EGP interconnect structure;
   forming a molded package body around the first microelectronic device, the EGP, and the backside EGP interconnect structure, the molded package body having a frontside at which the EGP is exposed; and
   producing one or more Redistribution Layers (RDLs) over the frontside of the molded packaged body, the one or more RDLs containing at least one interconnect line electrically coupled to the backside contact through the EGP and the backside EGP interconnect structure.

16. The method of claim 15 wherein the backside EGP interconnect structure comprises a metal clip.

17. The method of claim 15 wherein the electrically-conductive bonding material comprises a metal-filled epoxy, and wherein the method further comprises curing the metal-filled epoxy after positioning the backside EGP interconnect structure over the EGP, over the first microelectronic device, and in contact with the electrically-conductive bonding material.

18. The method of claim 15 further comprising electrically coupling the backside EGP interconnect structure between the EGP and a first terminal of a Surface Mount Device (SMD).

* * * * *